United States Patent
Suh et al.

(10) Patent No.: US 7,546,491 B2
(45) Date of Patent: Jun. 9, 2009

(54) SEMICONDUCTOR MEMORY DEVICE WITH STANDBY CURRENT FAILURE JUDGING FUNCTION AND METHOD FOR JUDGING STANDBY CURRENT FAILURE

(75) Inventors: Young-Ho Suh, Suwon-si (KR); Kyo-Min Sohn, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 772 days.

(21) Appl. No.: 10/802,210

(22) Filed: Mar. 17, 2004

(65) Prior Publication Data

US 2004/0233698 A1 Nov. 25, 2004

(30) Foreign Application Priority Data

Mar. 19, 2003 (KR) .................. 10-2003-0017238

(51) Int. Cl.
*G06F 11/00* (2006.01)
(52) U.S. Cl. ............... 714/42; 714/5; 714/6; 714/7; 714/8; 714/30
(58) Field of Classification Search ............ 714/710, 714/711, 5, 6, 7, 8, 30, 42
See application file for complete search history.

(56) References Cited

U.S. PATENT DOCUMENTS 4,173,029 A * 10/1979 Rabindran .................. 361/3
5,361,232 A * 11/1994 Petschauer et al. .......... 365/201
5,381,371 A * 1/1995 Haraguchi ................. 365/200
5,710,550 A * 1/1998 Hsieh et al. ................ 340/2.26
5,970,008 A * 10/1999 Zagar et al. ................ 365/226
5,987,632 A * 11/1999 Irrinki et al. ................ 714/711
2002/0167849 A1 11/2002 Ohbayashi et al.

FOREIGN PATENT DOCUMENTS

JP 02222922 9/2002

OTHER PUBLICATIONS

"Transistor" Microsoft Computer Dictionary (fifth edition). Copyright 2002. Microsoft Press.*
English Abstract.

* cited by examiner

*Primary Examiner*—Robert Beausoliel
*Assistant Examiner*—Joseph D Manoskey
(74) *Attorney, Agent, or Firm*—F. Chau & Associates

(57) ABSTRACT

A semiconductor memory device which a pad for receiving a power voltage, a first power line connected to the pad, and a plurality of second power lines respectively connected to memory cells of a repair unit. A selection circuit outputs selection signals for selecting the memory cells of the array in the repair unit in response to a row address in a test operation mode. A power switch circuit operates in response to the selection signals, and connects the second power line connected to the selected memory cells with the first power line in the test operation mode. The power switch circuit disconnects the remaining second power lines from the first power line.

25 Claims, 10 Drawing Sheets

124

SEMICONDUCTOR MEMORY DEVICE WITH STANDBY CURRENT FAILURE JUDGING FUNCTION AND METHOD FOR JUDGING STANDBY CURRENT FAILURE

BACKGROUND

1. Technical Field

The present disclosure relates to a semiconductor device, and more particularly, to a semiconductor memory device.

2. Discussion of Related Art

There is a growing trend of manufacturing semiconductor memory devices with higher integration density. One way to accomplish high integration in a semiconductor memory device is to reduce the size of a memory cell unit to allow for placement of more memory cells within a given area. As integrated memory devices became denser, the probability of defect occurrence in memory cells of a memory device increases, which in turn decreases yield of quality semiconductor memory devices.

Redundant memory cells are used to maintain high yield. For example, a memory cell having a defect can be replaced with a redundant memory cell under control of a decoding signal generated from a redundancy circuit in a semiconductor memory device. When a memory cell is tested to be defective, a programmable fuse in a redundancy circuit is cut off to achieve a redundancy operation. If an address signal is input to select a normal memory cell having a defect in a memory access mode, access is made to a redundancy memory cell instead of the normal memory cell having a defect.

Smaller memory cell units result in smaller spacings or gaps between conductor wires. As such, there is a higher risk of a hard type defect, such as a short-circuit between a bit line and a ground voltage line, between a pair of bit lines and a ground voltage line, between a cell node and a ground voltage line, or between a cell node and a power voltage line. Such a short-circuit causes a phenomenon called a standby current failure, in which excessive current flows through the ground at a standby state of a semiconductor memory device. To avoid this problem, a row or column having a memory cell in which the standby current failure occurs is replaced with a redundant row or column through the afore-mentioned redundancy technology.

Since a power voltage is still applied to memory cells of a defective row/column even after the defective row/column is replaced, an excessive standby current will be consumed. A variety of technologies for cutting-off the standby current consumed by the defective memory cell(s) are respectively disclosed in U.S. Pat. No. 5,390,150 issued on Feb. 14, 1995 entitled "SEMICONDUCTOR MEMORY DEVICE WITH REDUNDANCY STRUCTURE SUPPRESSING POWER CONSUMPTION", U.S. Pat. No. 5,703,816 issued on Dec. 30, 1997 entitled "FAILED MEMORY CELL REPAIR CIRCUIT OF SEMICONDUCTOR MEMORY", and U.S. Pat. No. 6,456,547 issued on Sep. 24, 2002 entitled "SEMICONDUCTOR MEMORY DEVICE WITH FUNCTION OF REPAIRING STANDBY CURRENT FAILURE". The above-mentioned U.S. patents disclose technologies for reducing consumption of the standby current resulting from a defective column by controlling a precharge circuit of the defective column and by controlling the power voltage supplied to a defective column.

To cut off the standby current caused by memory cells having standby current failure using the above-mentioned repair technology, the defective rows or columns must first be found. Accordingly, there is a need for a simple process that determines the defective rows or columns causing the standby current failure at a wafer level.

SUMMARY OF THE INVENTION

A semiconductor memory device according to an embodiment of the invention includes an array of memory cells arranged in rows and columns, means for selecting the memory cells of the array in a repair unit in a test operation mode, and means for supplying a power voltage to the selected memory cells in the test operation mode, and cutting off power to the remaining memory cells.

In at least one embodiment of the invention, the memory cells of the array are repaired in a row unit, and the selection unit selects the memory cells of the array in the repair unit in response to a row address in the test operation mode. The power voltage supplying unit includes a fuse. In the test operation mode, depending on variation of the power voltage, it is judged whether the selected memory cells include a memory cell having standby current failure. The fuse of the power voltage supplying unit is cut when the selected memory cells include the memory cell causing the standby current failure.

In at least one embodiment of the invention, the memory cells of the array are repaired in a column unit, and the selection unit selects the memory cells of the array in the repair unit in response to a column address in the test operation mode. The power voltage supplying unit includes a fuse, and in the test operation mode, depending on variation of the power voltage, it is judged whether the selected memory cells include the memory cell having the standby current failure. The fuse of the power voltage supplying unit is cut when the selected memory cells include the memory cell having the standby current failure.

A semiconductor memory device according to another embodiment of the invention includes a pad for receiving a power voltage, a first power line connected to the pad, a plurality of memory cells each including an array of memory cells arranged in rows and columns, and a plurality of second power lines each connected to a corresponding repair unit. A selection circuit outputs selection signals for selecting the memory cells corresponding to one of the repair units in response to a row address in a test operation mode. A switch circuit operates in response to the selection signals to connect the second power line connected to the selected memory cells with the first power line and to disconnect the remaining second power lines from the first power line, in the test operation mode.

In at least one embodiment, the semiconductor memory device further includes a precharge circuit for precharging the columns, and the precharge circuit is inactivated during the test operation mode.

A semiconductor memory device according to another embodiment of the invention includes a pad for receiving a power voltage, a first power line connected to the pad, a plurality of repair units, each of the plurality of repair units including an array of memory cells arranged in rows and columns, and a plurality of second power lines each connected to memory cells corresponding to one of the repair units. A selection circuit outputs selection signals for selecting the memory cells of the array in the repair unit in response to a column address in a test operation mode. A switch circuit operates in response to the selection signals to connect the second power line connected to the selected memory cells with the first power line and to disconnect the remaining second power lines from the first power line, in the test operation mode.

A semiconductor memory device according to another embodiment of the invention includes a plurality of repair units each having an array of memory cells arranged in rows and columns, first and second pads for respectively receiving a power voltage, a first power line electrically connected to the first pad, a second power line electrically connected to the second pad, a first switch circuit for selectively connecting the first and second power lines in response to a test operation mode signal, and a plurality of third power lines each electrically connected to a corresponding repair unit. A selection circuit selects the memory cells of the array in one of the repair units in a test operation mode. A second switch circuit connects the second power line to a third power line connected to the selected memory cells and disconnects remaining third lines from the second power line, in the test operation mode.

A semiconductor memory device according to another embodiment of the invention includes a first power line for receiving a power voltage, a plurality of repair units each including an array of memory cells arranged in rows and columns, a selection circuit for outputting selection signals for selecting the rows in one of the repair units in response to a row address, and second power lines each common-connected to the memory cells of a corresponding repair unit. A switch circuit connects one of the second power lines to the first power line in response to the selection signals, in a test operation mode.

In at least one embodiment, the semiconductor memory device further includes first and second pads for respectively receiving the power voltage, and the first power line is directly connected to the second pad and is connected to the first pad through a switch transistor. The switch transistor is controlled by a control signal that is based on whether the semiconductor memory device is in the test operation mode.

In at least one embodiment, the switch circuit includes switches each connected to a corresponding second power line, and each of the switches includes a NOR gate for receiving the control signal and a corresponding selection signal, and a PMOS transistor for connecting the first power line with a corresponding second power line in response to an output signal of the NOR gate. Each of the switches further includes a fuse connected between the PMOS transistor and the corresponding second power line.

A semiconductor memory device according to another embodiment of the invention includes a first power line for receiving a power voltage, a plurality of repair units each including an array of memory cells arranged in rows and columns, a selection circuit for outputting selection signals for selecting the columns in one of the repair units in response to a column address, and second power lines each common-connected to the memory cells of a corresponding repair unit. A switch circuit connects one of the second power lines to the first power line in response to the selection signals and disconnects the remaining second power lines from the first power line, in a test operation mode.

In at least one embodiment, the semiconductor memory device further includes first and second pads for respectively receiving the power voltage, and the first power line is directly connected to the second pad and is connected to the first pad through a switch transistor. The switch transistor is controlled by a control signal that is based on whether the semiconductor memory device is in a test operation mode.

A method for judging standby current failure in a semiconductor memory device having an array of memory cells arranged in rows and columns according to an embodiment of the invention includes the steps of generating selection signals for selecting the memory cells of the array in a repair unit during a test operation mode, supplying a power voltage to the selected memory cells in the test operation mode in response to the selection signals, and cutting off power-supply to the remaining memory cells, and judging whether the selected memory cells include a memory cell having standby current failure, depending on variation of the power voltage.

BRIEF DESCRIPTION OF THE DRAWINGS

The present invention will become more apparent by describing in detail exemplary embodiments thereof with reference to the attached drawings in which.

DESCRIPTION OF PREFERRED EMBODIMENTS

Reference will now be made to preferred embodiments of the present invention as illustrated in the accompanying drawings. However, the present invention is not limited to the embodiments illustrated herein after, and the embodiments herein are rather introduced to provide easy and complete understanding of the scope and spirit of the present invention.

Various exemplary embodiments of the present invention will be described using any one of semiconductor memory devices, such as, for instance, a static random access memory (SRAM) device. However, it is apparent to those having ordinary skill in the art that the present invention is not limited to the SRAM device. In the present disclosure, the term "power voltage to be supplied to a memory cell" has the same meaning as terms such as "power voltage for array", "cell power"

and the like. Also, in the present disclosure, a test operation mode judges whether there are memory cells causing standby current failure, and is performed at a wafer level.

According to an aspect of the present invention, a semiconductor memory device allows a row or column including the memory cell(s) causing standby current failure to be judged in a repair unit. The row or column including the memory cell(s) causing the standby current failure is substituted with a redundant row or column by a well-known redundancy technology. Furthermore, power supplied to the memory cells of the repair-unit rows or columns including a defective row or column is cut off.

Figure 1:
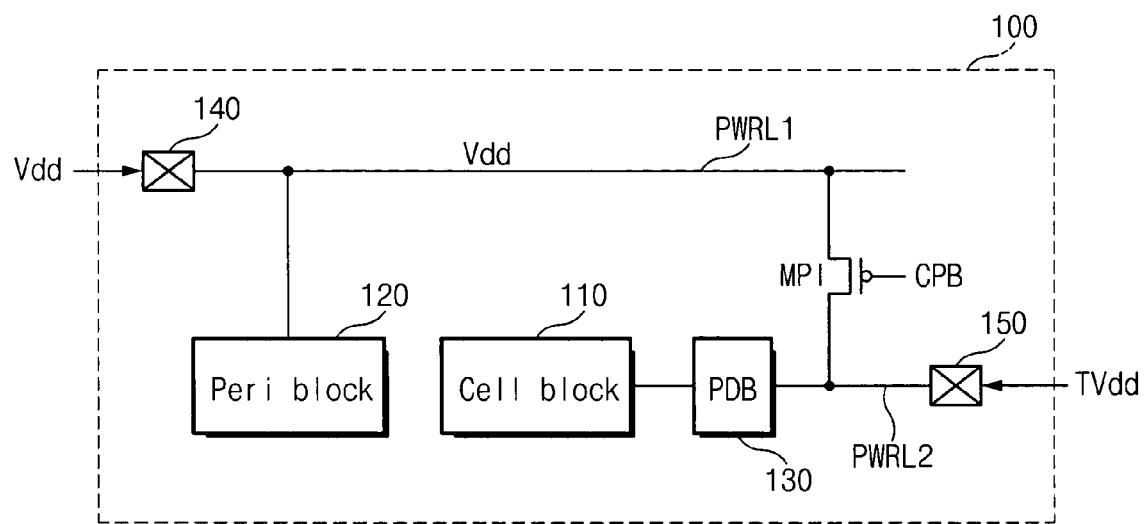
FIG. 1 is a schematic block diagram illustrating a semiconductor memory device in accordance with an embodiment of the present invention.

FIG. 1 is a schematic block diagram illustrating a semiconductor memory device in accordance with an embodiment of the present invention.

Referring to FIG. 1, a semiconductor memory device 100 includes a cell array block 110 and a peripheral circuit block 120. The cell array block 110 stores data information therein, and includes a plurality of memory cells arranged in a matrix of rows (or word lines) and columns (or bit lines). The peripheral circuit block 120 writes data into the cell array block 110 or reads data from the cell array block 110. These blocks will be described hereinafter.

The semiconductor memory device 100 further includes a power distribution block 130 (designated as "PDB" in the drawings), pads 140 and 150, and a switch transistor MP1. The pad 140 is bonded to a power pin (for instance, a Vdd pin), while as the pad 150 is not bonded to any pin at a package level. A power line PWRL1 is connected to the pad 140, and a power line PWRL2 is connected to the pad 150. The peripheral circuit block 120 receives an operation voltage through the pad 140 and the power line PWRL1. The switch transistor MP1 is connected between the power lines PWRL1 and PWRL2, and is turned-on/off by a control signal CPB. For example, the switch transistor MP1 is turned-off in the test operation mode and turned-on in a normal operation mode. The control signal CPB is at a high level in the test operation mode at the wafer level and is at a low level in the normal operation mode at the package level.

The power distribution block 130 receives a power voltage from the power line PWRL2 connected to the pad 150 in the test operation mode at the wafer level since the switch transistor MP1 is turned-off. In the test operation mode, the power distribution block 130 supplies the power voltage to the memory cells selected in the repair unit, and cuts off supply of the power voltage to remaining memory cells. This allows the standby current failure of the memory cells to be measured in the repair unit in the test operation mode. The switch transistor MP1 is turned-on and no power voltage is supplied to the pad 150 in the normal operation mode, and thus the power distribution block 130 receives the power voltage from the power line PWRL1. In the normal operation mode, the power distribution block 130 supplies the power voltage to all memory cells of the cell array block or the memory cells other than the repaired memory cells.

Figure 2:
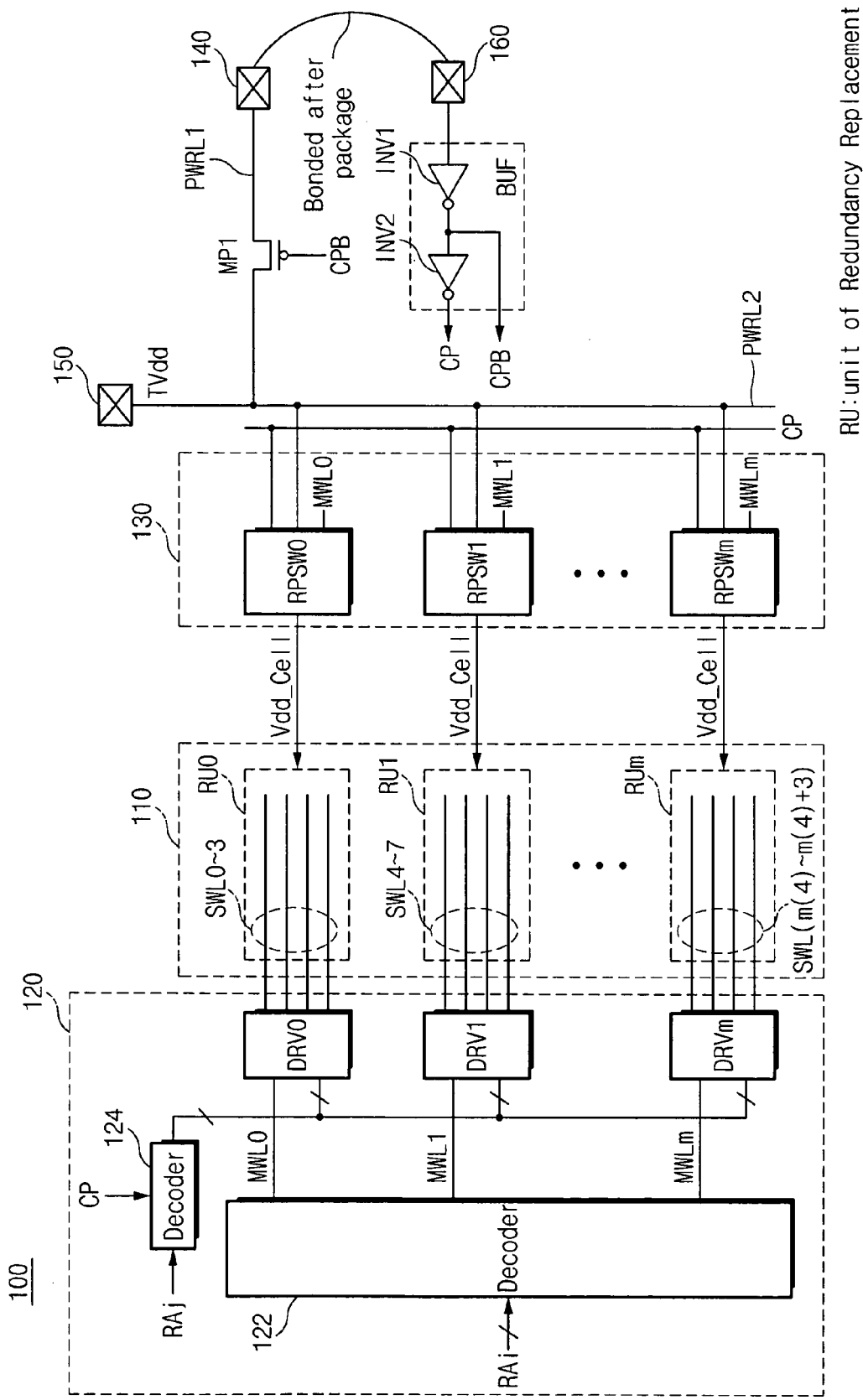
FIG. 2 is a schematic block diagram illustrating a semiconductor memory device in accordance with a an embodiment of the present invention.

FIG. 2 is a schematic block diagram illustrating a semiconductor memory device in accordance with an embodiment of the present invention.

The cell array block 110 shown in FIG. 2 includes a plurality of sub-word lines SWL0-SWLm, each of which is connected with a plurality of memory cells. For example, SRAM cells comprised of six transistors are connected to each of the sub-word lines. The semiconductor memory device 100 in accordance with the present embodiment of the invention includes a peripheral circuit block 120. The peripheral circuit block 120 includes a first decoder 122, a second decoder 124, and word line drivers DRV0-DRVm. Though not illustrated in the drawings, it is apparent that the peripheral circuit block 120 further includes circuits needed to perform a row selection function.

The first decoder 122 outputs selection signals through main word lines MWL0-MWLm in response to a row address RAi. The main word lines MWL0-MWLm are respectively connected to corresponding drivers DRV0-DRVm. Each of the drivers DRV0-DRVm is connected to a plurality of, for example, four sub-word lines corresponding to each of the main word lines. For example, the driver DRV0 is connected to the sub-word lines SWL0-SWL3 corresponding to the main word line MWL0, the driver DRV1 is connected to the sub-word lines SWL4-SWL7 corresponding to the main word line MWL1, and the driver DRVm is connected to the sub-word lines SWL(m(4))-SWL(m(4)+3) corresponding to the main word line MWLm. The second decoder 124 outputs selection signals DRA0-DRA3 in response to a row address RAj, and the selection signals DRA0-DRA3 are respectively transmitted to the drivers DRV0-DRVm. The selection signals DRA0-DRA3 from the second decoder 124 are set at the low level by a control signal CP irrespective of the inputted address RAj in the test operation mode. Accordingly, in the test operation mode, even though one of the main word lines MWL0-MWLm is selected, the sub-word lines belonging to the selected main word line are not activated. This is to judge whether the memory cells (or the repair-unit memory cells) corresponding to the selected main word line include the memory cell causing the standby current failure.

Under assumption that the defective cells are repaired in a row unit, in case the memory cell connected to any sub-word line is the defective cell, the sub-word line of the defective cell and its related sub-word lines will be substituted with the redundant rows. For example, in case the sub-word line SWL0 is the defective row, all of the sub-word lines SWL0-SWL3 corresponding to the main word line MWL0 will be substituted with corresponding redundant rows. In the semiconductor memory device according to the present embodiment of the invention, when the main word lines are sequentially or randomly selected, the power voltage is supplied only to the memory cells connected to the sub-word lines which correspond to the selected main word line (or the memory cells belonging to the repair unit) through the power distribution block 130. Referring to FIG. 2, the power distribution block 130 is connected to the power line PWRL2, and includes the power switches RPSW0-RPSWm respectively corresponding to the main word lines MWL0-MWLm. As described above, the power line PWRL2 receives the power voltage from the pad 150 in the test operation mode, and receives the power voltage from the pad 140 through the switch transistor MP1 in the normal operation mode. The power switch RPSW0 receives the power voltage from the power line PWRL2, and selectively supplies the power voltage Vdd_Cell to the memory cells of the sub-word lines SWL0-SWL3 belonging to the repair unit RU0 in response to the selection signal MWL0 and the control signal CP. The power switch RPSW1 receives the power voltage from the power line PWRL2, and selectively supplies the power voltage Vdd_Cell to the memory cells of the sub-word lines SWL4-SWL7 belonging to the repair unit RU1. Additionally, the power switch RPSWm receives the power voltage from the power line PWRL2, and selectively supplies the power voltage Vdd_Cell to the memory cells of the sub-word lines SWL(m(4))-SWL(m(4)+3) belonging to the repair unit RUm in response to the selection signal MWLm and the control signal CP.

For example, in the normal operation mode, the power switches RPSW0-RPSWm supply the power voltage Vdd- _Cell to the corresponding repair-unit memory cells irrespective of the selections signals MWL0-MWLm. That is, in the normal operation mode, the power voltage is supplied to all memory cells. In the test operation mode, only one of the power switches RPSW0-RPSWm supplies the power voltage to the repair-unit memory cells. For example, the power switch RPSW0 supplies the power voltage Vdd_Cell to the memory cell connected to the sub-word lines SWL0-SWL3 only when the selection signal MWL0 is activated. The remaining power switches RPSW1-RPSWm operate in the same manner as the power switch RPSW0.

In the test operation mode, after the power voltage is supplied to only the repair-unit memory cells, a voltage variation of the pad 150 is detected such that it can be judged whether the repair-unit memory cells include the memory cells causing the standby current failure. The voltage variation of the pad 150 will be detected through a test device (not shown).

As shown in FIG. 2, the inventive semiconductor memory device 100 further includes a buffer (designated as "BUF" in the drawings) comprised of the pad 160 and inverters INV1 and INV2. In the test operation mode, the pad 160 receives a ground voltage through the test device (not shown). Accordingly, the control signal CP is at the low level in the test operation mode. At the package level, the pad 160 is bonded to the power pad 140 or another pad (not shown) having a high-level voltage. Accordingly, the control signal CP is at the high level in the normal operation mode.

In this embodiment, the first decoder 122 constitutes a selection circuit for generating the selection signals for selecting the rows of the memory cells in the repair unit in response to the row address.

Figure 3:
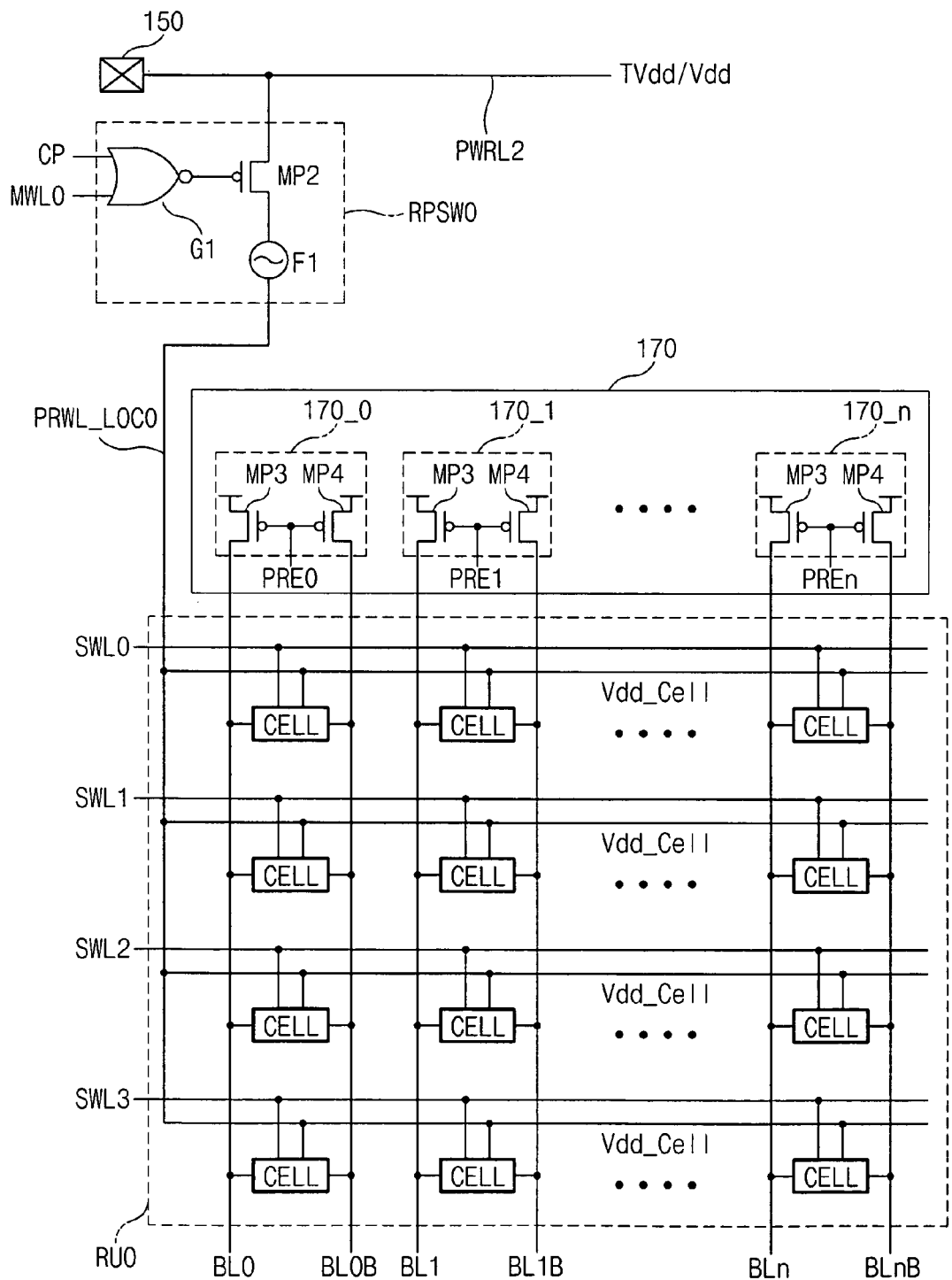
FIG. 3 is a block diagram illustrating the power switch RPSW0 of FIG. 2 and its corresponding repair-unit memory cells according to an embodiment of the invention.

FIG. 3 is a block diagram illustrating the power switch RPSW0 of FIG. 2 and its corresponding repair-unit memory cells.

Referring to FIG. 3, four sub-word lines SWL0-SWL3 constitute the repair unit RU0. The SRAM cells as the memory cells are connected to each of the sub-word lines SWL0-SWL3. The memory cells of each column are connected between a corresponding pair of bit lines (BL0, BL0B)-(BLn, BLnB). As described above, during the test operation mode, the repair-unit sub-word lines SWL0-SWL3 are not activated though the corresponding main word line MWL0 is selected. The memory cells of the repair-unit RU0 are supplied with the power voltage Vdd_Cell from a local power line PWRL_LOCO, as an operation voltage. The local power line PWRL_LOCO is connected to the power switch RPSW0.

The power switch RPSW0 selectively connects the power voltage TVdd/Vdd from the power line PWRL2 with the local power line PWRL_LOCO in response to the control signal CP and the selection signal MWL0, and includes a NOR gate G1, a PMOS transistor MP2, and a fuse F1. The NOR gate GI controls the PMOS transistor MP2 in response to the control signal CP and the selection signal MWL0. The PMOS transistor MP2 and the fuse F1 are series-connected between the lines PWRL2 and PWRL_LOCO.

Figure 4:
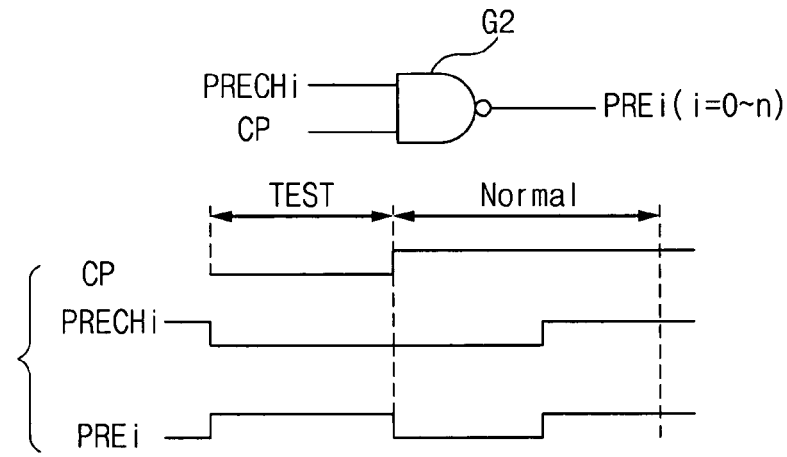
FIG. 4 is a circuit diagram illustrating a precharge signal generating circuit in accordance with an embodiment of the present invention.

A precharge circuit 170 is connected to the bit lines constituting the columns, and the precharge circuit 170 includes bit line precharge parts 170_0-170_n connected to the bit lines of the corresponding columns. Each of the precharge parts 170_0-170_n is comprised of PMOS transistors MP3 and MP4 controlled by a corresponding control signal PREi (i=0-n). FIG. 4 illustrates a control signal generating circuit 180 for generating the control signal PREi. The control signal generating circuit 180 is comprised of a NAND gate G2. The control signal PREi is maintained at the high level irrespective of a precharge signal PRECHi corresponding to each of the columns in the test operation mode, and depends on the precharge signal PRECHi irrespective of the control signal CP in the normal operation mode. Accordingly, the bit line precharge parts 170_0-170_n precharge the bit lines (BL0, BL0B)-(BLn,BLnB) of the corresponding columns depending on the precharge signal PRECHi in the normal operation mode, and are inactivated in the test operation mode.

Figure 5:
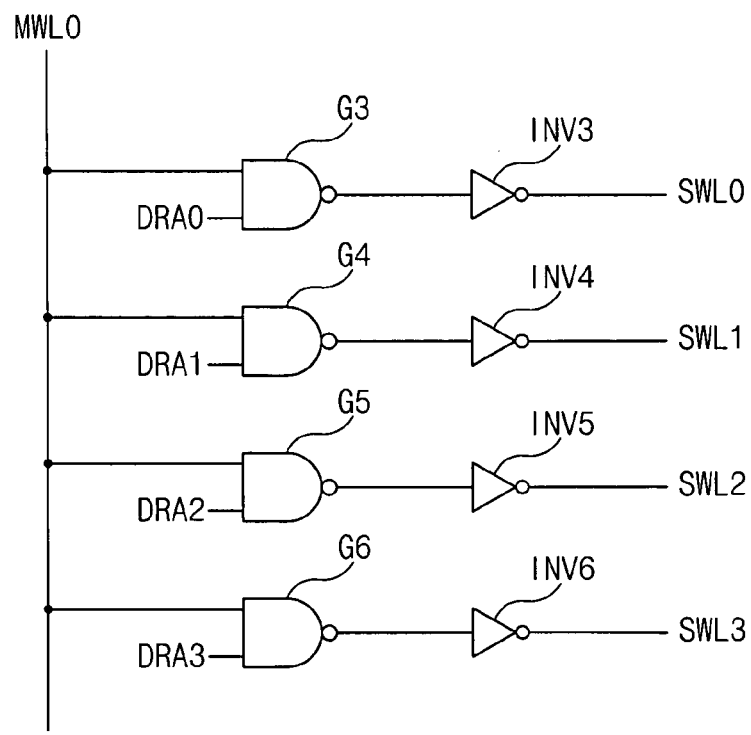
FIG. 5 is a circuit diagram illustrating a driver DRV0 of FIG. 2 in accordance with a an embodiment of the present invention.

FIG. 5 is a circuit diagram illustrating the driver DRV0 of FIG. 2 in accordance with a preferred embodiment of the present invention.

Referring to FIG. 5, the driver DRV0 includes four NAND gates G3, G4, G5 and G6 and four inverters INV3, INV4, INV5 and INV6, which are connected as shown in the drawing. In the normal operation mode, when the main word line MWL0 is activated and one (for example, DRA0) of the selection signals DRA0-DRA3 is at the high level, the sub-word line SWL0 is selected. In the test operation mode, since the main word line MWL0 is activated and the selection signals DRA0-DRA3 are inactivated, the sub-word lines SWL0-SWL3 are not selected.

Figure 6:
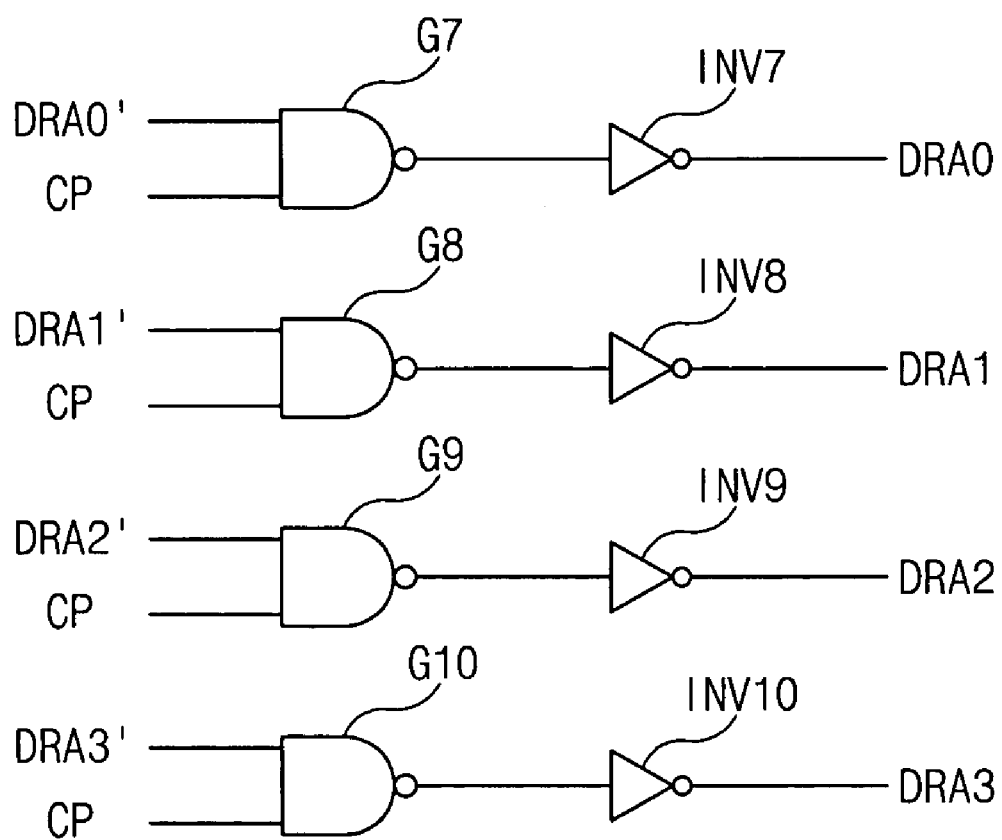
FIG. 6 is a circuit diagram illustrating the second decoder shown in FIG. 2.

FIG. 6 is a circuit diagram illustrating the second decoder 124 shown in FIG. 2. In the decoder 124, the logic states of the output signals DRA0-DRA3 are determined depending on the control signal CP. For example, when the control signal CP is at the low level, that is, is in the test operation mode, the output signals DRA0-DRA3 are set at the low level irrespective of logic states of input signals DRA0'-DRA3' from a previous decoding circuit (not shown). When the control signal CP is at the high level, that is, in the normal operation mode, the logic states of the output signals DRA0-DRA3 are set depending on the logic states of the input signals DRA0'-DRA3'.

Hereinafter, an operation of the semiconductor memory device in accordance with the present embodiment of the invention will be described with reference to FIGS. 1 to 6.

In the test operation mode, the pads 140 and 150 are respectively supplied with the power voltages Vdd and TVdd, and the pad 160 is supplied with a low-level voltage. At this time, since the PMOS transistor MP 1 is turned-off, the peripheral circuit block 120 receives the power voltage Vdd from the pad 140, and the cell array block 110 receives the power voltage TVdd from the pad 150. The first decoder 122 activates one of the selection signals MWL0-MWLm in response to a row address RAi. That is, one main word line (for example, MWL0) is selected. Since the control signal CP is at the low level in the test operation mode, the output signals DRA0-DRA3 of the second decoder 124 are at the low level. This means that the sub-word lines corresponding to the selected main word line are not selected.

When the main word line MWL0 is selected, only a power switch RPSW0 is operated and the remaining power switches RPSW1-RPSWm are not operated. In the power switch RPSW0, when the main word line MWL0 is selected, the PMOS transistor MP2 is turned-on and the power voltage Vdd_Cell is supplied to the repair-unit memory cells. At this time, the bit line precharge circuits 170_0-170_n are all inactivated, and as a result, current supply to the bit lines (BL0,BL0B)-(BLn,BLnB) is cut off.

In this state, the voltage variation of the pad 150 will be detected/checked through the test device (not shown). In other words, depending on the voltage variation of the pad 150, it can be judged whether the repair-unit memory cells include the memory cell(s) causing the standby current failure. In case the repair-unit memory cells include the memory cell(s) causing the standby current failure, the fuse F1 is cut to allow the local power line PWRL_LOCO connected to the repair-unit memory cells to be electrically disconnected from the power line PWRL2. Thus, the standby current can be prevented from being consumed by the memory cell(s) causing the standby current failure.

To the contrary, in each of the power switches RPSW1-RPSWm, since the corresponding main word line is at the low level, the PMOS transistor MP2 is turned-off, and no power voltage Vdd_Cell is supplied to the repair-unit memory cells.

Accordingly, the power voltage is supplied to the memory cells selected in the repair unit, while as no power voltage is supplied to the remaining memory cells. In this state, the rows including the memory cell(s) causing the standby current failure can be determined by measuring standby current of the memory cells belonging to the repair unit FIG. 7 is a block diagram illustrating a semiconductor memory device in accordance with another embodiment of the present invention.

Figure 7:
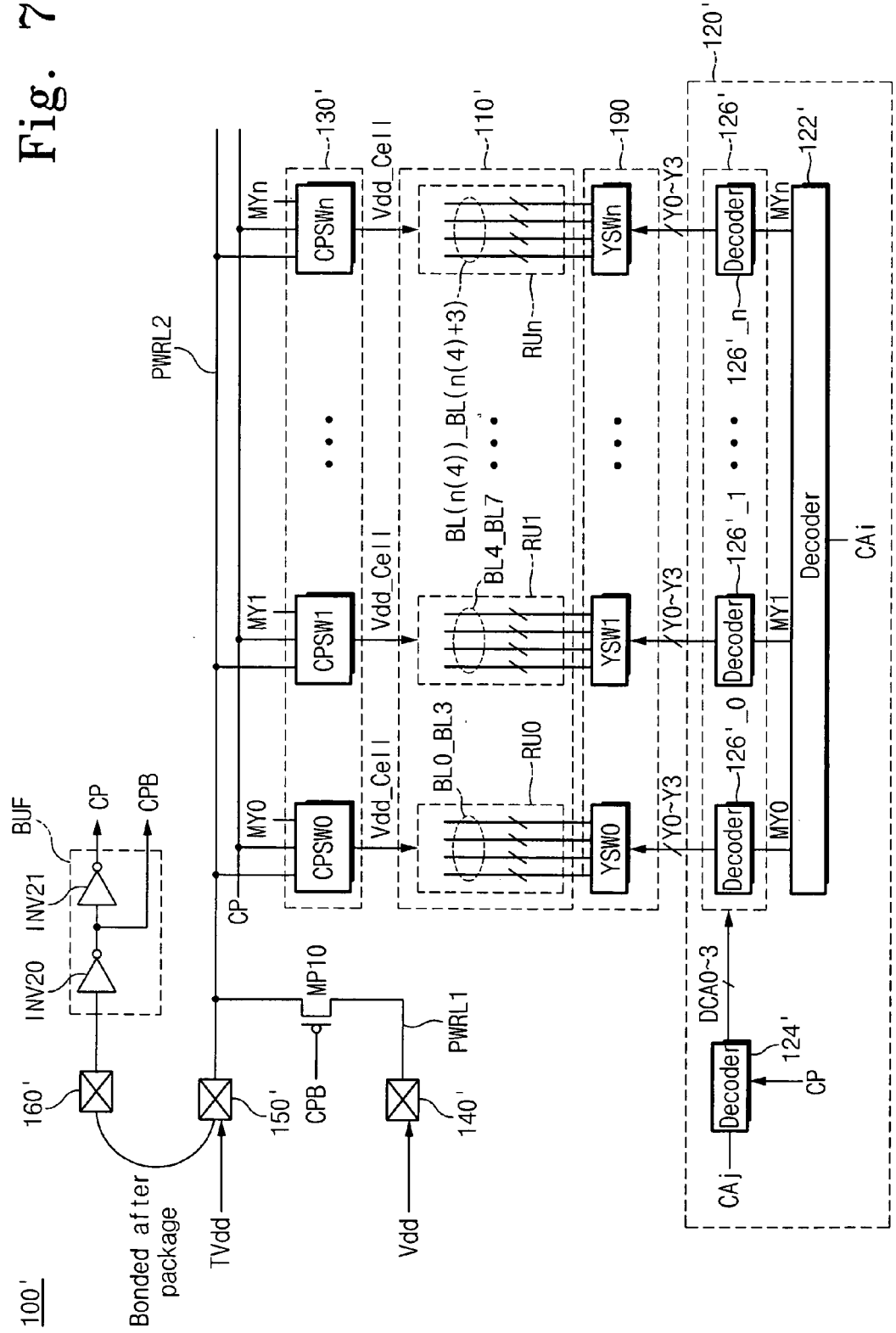
FIG. 7 is a block diagram illustrating a semiconductor memory device in accordance with another embodiment of the present invention.

Referring to FIG. 7, the semiconductor memory device 100' includes a cell array block 110' and a peripheral circuit block 120'. The cell array block 110' includes a plurality of columns, each of which is comprised of a pair of bit lines. For example, a first column is comprised of a pair of bit lines BL0 and BL0B. For convenience of illustration in FIG. 7, each of the pair of bit lines, or columns is designated as "BL" even though each pair of bit lines includes a bit line "BL" and another bit line "BLB". The plurality of memory cells is connected between the bit lines of each of the columns. For example, SRAM cells comprised of six transistors are connected between the bit lines of each of the columns. The columns of the cell array block 110' are separated into repair units. For example, the columns BL0-BL3 constitute the repair unit RU0, the columns BL4-BL7 constitute the repair unit RU1, and the columns BL(n(4))-BL(n(4)+3) constitute the repair unit RUn. A column switch circuit 190 includes a plurality of column switches YSW0-YSWn. Each of the column switches is connected to corresponding columns or bit lines of the repair unit. For example, the column switch YSW0 is connected to the bit lines BL0-BL3 of the repair unit RU0, the column switch YSW1 is connected to the bit lines BL4-BL7 of the repair unit RU1, and the column switch YSWn is connected to the bit lines BL(n(4))-BL(n(4)+3) of the repair unit RUn.

Referring to FIG. 7, the semiconductor memory device 100' further includes a first decoder 122', a second decoder 124', and third decoders 126'_0-126'_n, which constitute the peripheral circuit block 120'. Though not illustrated in the drawing, it is apparent that the peripheral circuit block 120' further includes circuits needed to perform the column selection function.

The first decoder 122' outputs selection signals MY0-MYn in response to a column address CAi. The second decoder 124' outputs selection signals DCA0-DCA3 in response to a column address CAj. The selection signals DCA0-DCA3 from the second decoder 124' are set at the low level by the control signal CP irrespective of the input address CAj in the test operation mode. The third decoders 126'_0-126'_n respectively correspond to the selection signals MY0-MYn from the first decoder 122'. The third decoders 126'_0-126'_n output switch signals Y0-Y3 in response to the corresponding selection signal from the first decoder 122' and the selection signals DCA0-DCA3 from the second decoder 124'. Since the selection signals DCA0-DCA3 are all at the low levels in the test operation mode, when the selection signal (for example, MY0) is activated, a column switch corresponding to the activated selection signal (for example, YSW0) is inactivated.

Under assumption that defective cells are repaired in column units, in case the memory cell of any column is the defective cell, the column of the defective cell and its related columns will be substituted with the redundant columns. For example, in case the column BL0 is the defective column, the columns BL0-BL3 corresponding to the selection signal MY0 will be all substituted with corresponding redundant columns. When the selection signals MY0-MYn are sequentially or randomly activated, the power voltage is supplied only to the memory cells of the columns corresponding to the activated selection signals (or the memory cells belonging to the repair unit) through a power distribution block 130'. The power distribution block 130' is connected to the power line PWRL2, and includes the power switches CPSW0-CPSWm respectively corresponding to the selection signals MY0-MYn. The power line PWRL2 receives the power voltage from the pad 150' in the test operation mode, and receives the power voltage from the pad 140' through a switch transistor MP10 in the normal operation mode. The power switch CPSW0 receives the power voltage from the power line PWRL2, and selectively supplies the power voltage Vdd_Cell to the memory cells of the columns belonging to the repair unit RU0 in response to the selection signal MY0 and the control signal CP. The power switch CPSW1 receives the power voltage from the power line PWRL2, and selectively supplies the power voltage Vdd_Cell to the memory cells of the columns belonging to the repair unit RU1 in response to the selection signal MY1 and the control signal CP. Additionally, the power switch CPSWn receives the power voltage from the power line PWRL2, and selectively supplies the power voltage Vdd_Cell to the memory cells of the columns belonging to the repair unit RUn in response to the selection signal MYn and the control signal CP.

For example, in the normal operation mode, the power switches CPSW0-CPSWn supply the power voltage Vdd_Cell to the corresponding repair-unit memory cells irrespective of the selections signals MY0-MYn. That is, in the normal operation mode, the power voltage is supplied to all memory cells. In the test operation mode, only one of the power switches CPSW0-CPSWn supplies the power voltage to the repair-unit memory cells. For example, the power switch CPSW0 supplies the power voltage Vdd_Cell to the memory cells connected to the columns of the repair unit RU0 only when the selection signal MY0 is activated. The remaining power switches CPSW1-CPSWn operate in the same manner as the power switch CPSW0.

In the test operation mode, after the power voltage is supplied to only the repair-unit memory cells, voltage variation of the pad 150' is detected to judge whether the repair-unit memory cells include the memory cells causing standby current failure. The voltage variation of the pad 150' will be detected through a test device (not shown).

As shown in FIG. 7, the semiconductor memory device 100' in accordance with the present embodiment of the invention further includes a buffer (designated as "BUF" in the drawings) comprised of the pad 160' and inverters INV20 and INV21, which constitute a circuit for generating the control signal CP. The pad 160' receives a ground voltage through the test device (not shown) in the test operation mode. Accordingly, the control signal CP is at the low level in the test operation mode. At the package level, the pad 160' is bonded to the power pad 140' or another pad (not shown) having a high-level voltage. Accordingly, the control signal CP is at the high level in the normal operation mode.

Figure 8:
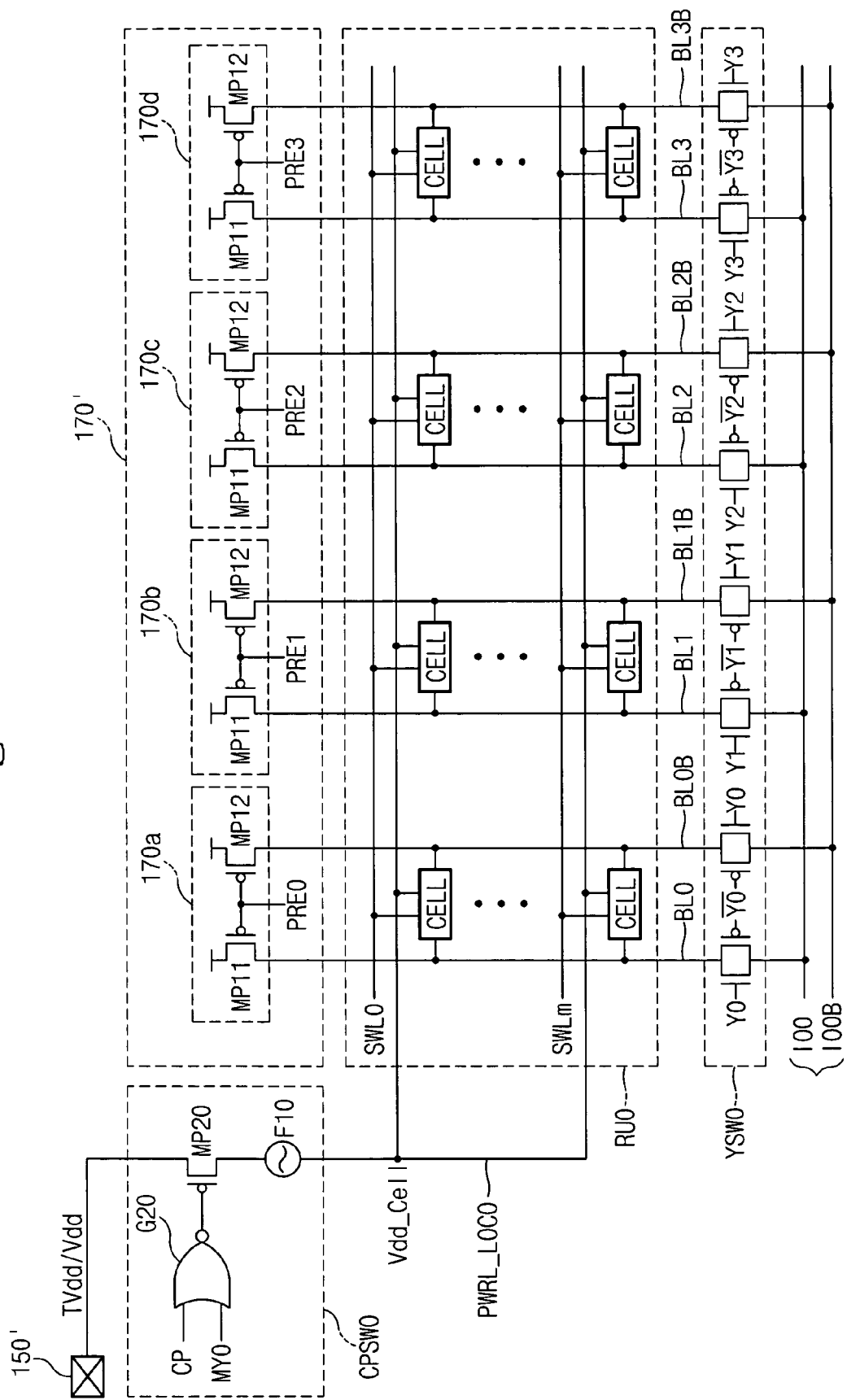
FIG. 8 is a block diagram illustrating a power switch CPSW0 of FIG. 7 and its corresponding repair-unit memory cells according to an embodiment of the invention.

FIG. 8 is a block diagram illustrating the power switch CPSW0 of FIG. 7 and its corresponding repair-unit memory cells.

Referring to FIG. 8, four pairs of bit lines (BL0, BL0B), (BL1, BL1B), (BL2, BL2B) and (BL3, BL3B) constitute the repair unit RU0. The SRAM cells as the memory cells are connected between corresponding pairs of bit lines. As described above, during the test operation mode, when the corresponding selection signal MY0 is activated, the column switch YSW0 is not operated. This is because the switch signals Y0-Y3 are inactivated during the test operation mode. The memory cells of the repair-units RU0 receive the power voltage Vdd_Cell from a local power line PWRL_LOCO, as an operation voltage. The local power line PWRL_LOCO is connected to the power switch CPSW0.

As illustrated in FIG. 8, the power switch CPSW0 includes a NOR gate G20, a PMOS transistor MP20, and a fuse F10. The power switch CPSW0 selectively connects the power voltage TVdd/Vdd of the power line PWRL2 with the local power line PWRL_LOCO in response to the control signal CP and the selection signal MY0. The NOR gate G20 controls the PMOS transistor MP20 in response to the control signal CP and the selection signal MY0. The PMOS transistor MP20 and the fuse F10 are series-connected between the lines PWRL2 and PWRL_LOCO.

Figure 9:
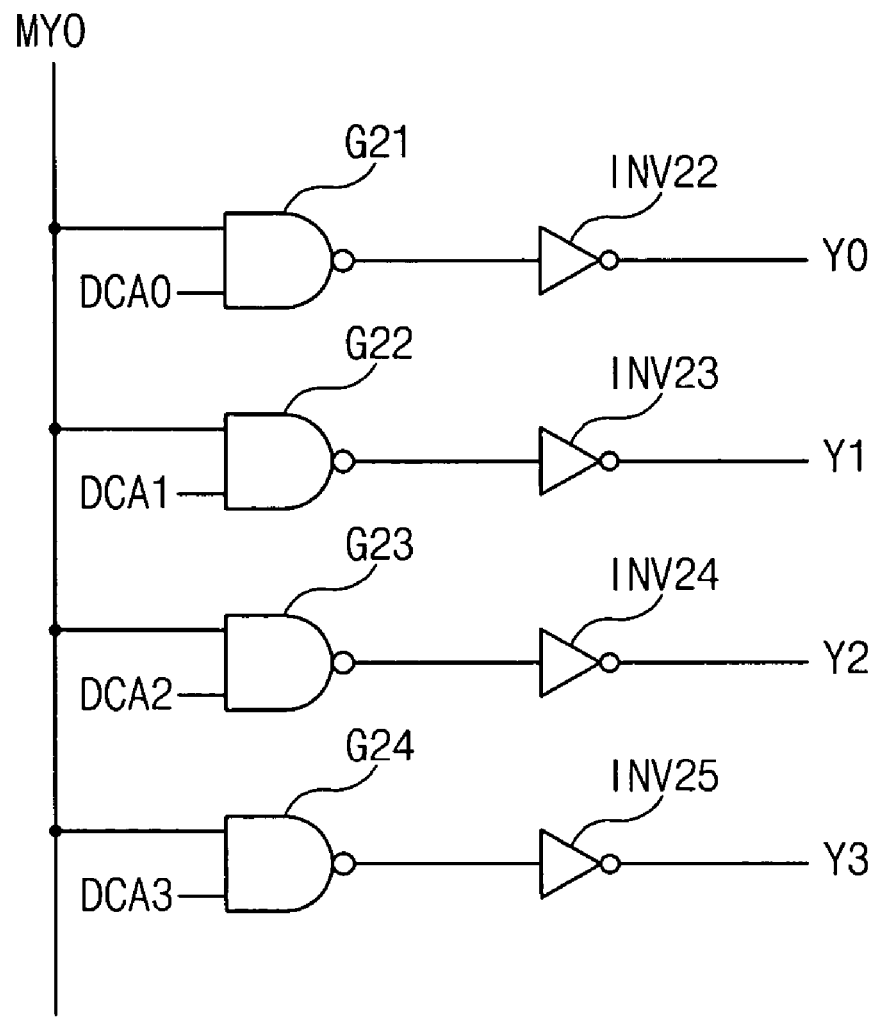
FIG. 9 is a circuit diagram illustrating a decoder 126'_0 of FIG. 7 in accordance with an embodiment of the present invention.

The columns BL0-BL3 are connected to the precharge circuit 170', which includes bit line precharge parts 170a, 170b, 170c, 170d connected to the bit lines of the corresponding columns. Each of the precharge parts 170a, 170b, 170c, 170d is comprised of PMOS transistors MP11 and MP12 controlled by a corresponding control signal PREi (i=0-3). FIG. 9 is a circuit diagram illustrating the decoder 126'_0 of FIG. 7.

Referring to FIG. 9, the decoder 126'_0 includes four NAND gates G21, G22, G23 and G24 and four inverters INV22, INV23, INV24 and INV25, which are connected as shown in the drawings. In the normal operation mode, when the selection signal MY0 is activated and one (for example, DCA0) of the selection signals DCA0-DCA3 is at the high level, the switch signal Y0 is activated. In the test operation mode, when the selection signal MY0 is activated and the selection signals DCA0-DCA3 are inactivated, the switch signals Y0-Y3 are inactivated.

Figure 10:
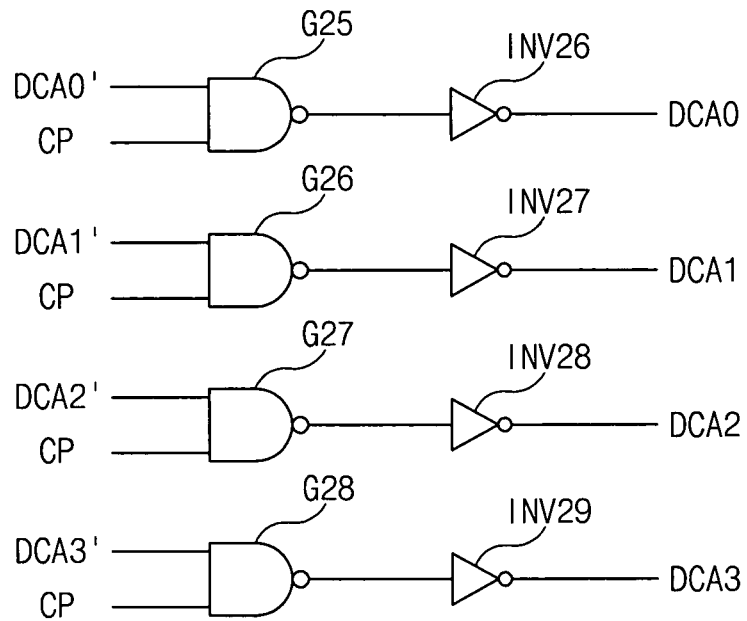
FIG. 10 is a circuit diagram illustrating a second decoder shown in FIG. 7 according to an embodiment of the invention.

FIG. 10 is a circuit diagram illustrating the second decoder 124' shown in FIG. 7.

Referring to FIG. 10, the decoder 124' includes NAND gates G25, G26, G27 and G28 and inverters INV26, INV27, INV28 and INV29. The logic states of the output signals DCA0-DCA3 are determined based on the control signal CP. For example, when the control signal CP is at the low level, that is, in the test operation mode, the output signals DCA0-DCA3 are set at the low level irrespective of the logic states of the input signals DCA0'-DCA3' from a previous decoding circuit (not shown). When the control signal CP is at the high level, that is, is in the normal operation mode, the logic states of the output signals DCA0-DCA3 are set depending on the logic states of the input signals DCA0'-DCA3'.

Figure 11:
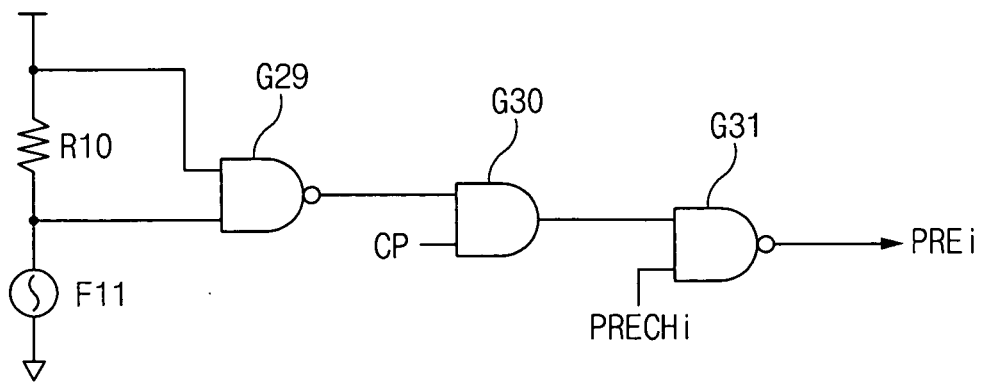
FIG. 11 is a circuit diagram illustrating a precharge signal generating circuit in accordance with an embodiment of the present invention.

FIG. 11 is a circuit diagram illustrating a precharge signal generating circuit 180' in accordance with a preferred embodiment of the present invention.

The precharge signal generating circuit 180' shown in FIG. 11 corresponds to one of the columns, and is comprised of a resistor R10, a fuse F11, NAND gates G29 and G31, and an AND gate G30. When the fuse F11 is not cut, an output of the AND gate G30 is determined based on the control signal CP. That is, in case the fuse F11 is not cut, the output of the AND gate G30 is at the high level when the control signal CP is at the high level (or in the normal operation mode), and is at the low level when the control signal CP is at the low level (or in the test operation mode). In this state, the precharge signal PREi depends on the control signal PRECHi in the normal operation mode and on the output of the AND gate G30 in the test operation mode. In case any column is judged as the defective column, the fuse F11 is cut, and the output of the AND gate G30 is at the low level irrespective of the control signal CP. Accordingly, since the precharge signal PREi is fixed at the high level, the precharge circuit 170' is inactivated such that current supply to the bit lines is cut off.

Hereinafter, an operation of the semiconductor memory device in accordance with the present embodiment of the invention will be described with reference to FIGS. 7-11.

In the test operation mode, the power voltages Vdd and TVdd are respectively supplied to the pads 140' and 150', and a low-level voltage is supplied to the pad 160'. At this time, since the PMOS transistor MP10 is turned-off, the peripheral circuit block 120' is supplied with the power voltage Vdd from the pad 140', and the cell array block 110' is supplied with the power voltage TVdd from the pad 150'. The first decoder 122' activates one of the selection signals MY0-MYn in response to the column address CAi. For example, the selection signal MY0 is activated. Since the control signal CP is at the low level in the test operation mode, the output signals DCA0-DCA3 of the second decoder 124' are at the low level. This means that the column switch block YSW0 corresponding to the activated selection signal MY0 is inactivated.

When the selection signal MY0 is activated, only a power switch CPSW0 is operated and the remaining power switches CPSW1-CPSWn are not operated. In the power switch CPSW0, when the selection signal MY0 is activated at the high level, the PMOS transistor MP20 is turned-on and the repair-unit memory cells receive the power voltage Vdd_Cell through the PMOS transistor MP20 and the fuse F10. At this time, the bit line precharge circuits 170a-170d are all inactivated, and as a result, the current supply to the bit lines is cut off.

In this state, the voltage variation of the pad 150' will be detected/checked through the test device (not shown). In other words, depending on the voltage variation of the pad 150', it can be judged whether the repair-unit memory cells include the memory cell(s) causing the standby current failure. In case the repair-unit memory cells include the memory cell(s) causing the standby current failure, the fuse F10 is cut such that the local power line PWRL_LOCO connected to the repair-unit memory cells is electrically disconnected from the power line PWRL2. Thus, the standby current can be prevented from being consumed by the memory cell(s) causing the standby current failure.

To the contrary, in each of the power switches CPSW1-CPSWn, since the corresponding selection signals are at the low level, the PMOS transistor MP20 is turned-off, and no power voltage Vdd_Cell is supplied to the repair-unit memory cells.

Accordingly, the memory cells selected in the repair unit receive the power voltage, whileas the remaining memory cells do not receive the power voltage. In this state, the rows including the memory cell(s) causing the standby current failure can be determined by measuring standby current of the memory cells in the repair unit.

Figure 12:
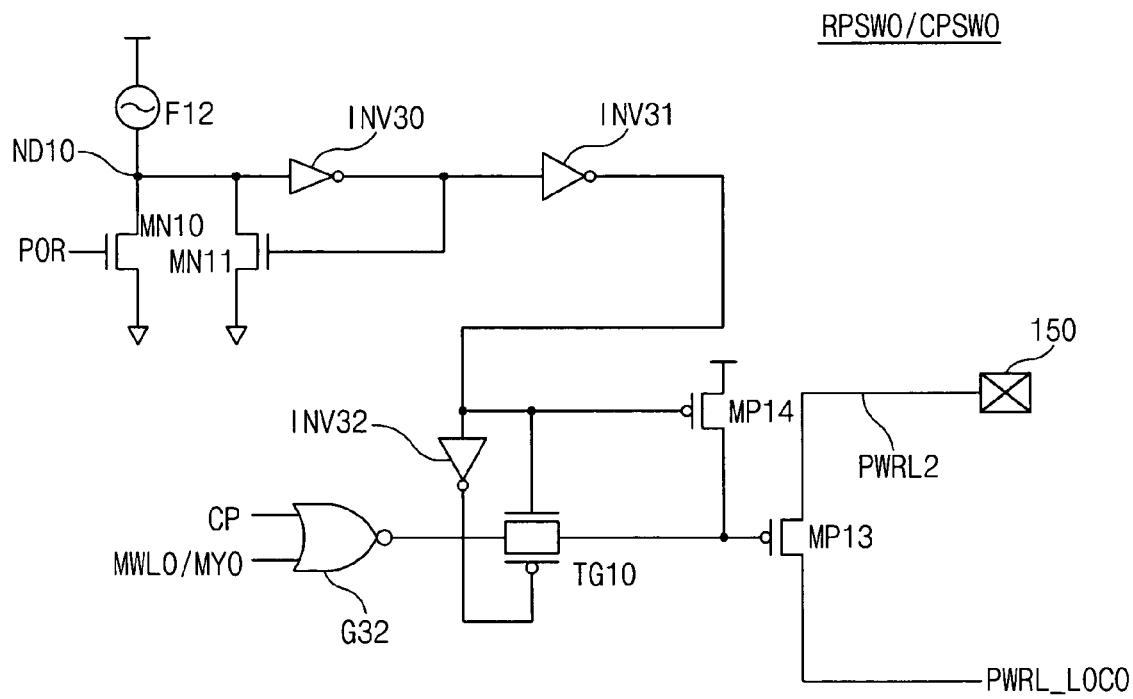
FIG. 12 is a circuit diagram illustrating power switches RPSW0/CPSW0 in accordance with the an embodiment of the present invention.

FIG. 12 is a circuit diagram illustrating the power switch RPSW0/CPSW0 in accordance with another embodiment of the present invention.

Referring to FIG. 12, the power switch RPSW0/CPSW0 includes a fuse F12, NMOS transistors MN10 and MN11, PMOS transistors MP13 and MP14, a transmission gate TG10, inverters INV30, INV31 and INV32, and a NOR gate G32, which are connected as illustrated in the drawings. A control signal POR is a power-on reset signal, and has a high-level pulse at the time of power-up. In case the fuse F12 is not cut, a node ND10 is set at the high level, so that a signal path of the transmission gate TG10 is formed and the PMOS transistor MP14 is turned-off. This allows the PMOS transistor MP13 to be turned-on/off according to an output of the NOR gate G32. For example, since the control signal CP is set at the high level in the normal operation mode, the PMOS transistor MP13 is turned-on irrespective of the selection signal MWL0/MY0. Since the control signal CP is set at the low level in the test operation mode, the PMOS transistor MP13 is turned on/off depending on the logic state of the selection signal MWL0/MY0. In case the fuse F12 is cut, the node ND10 is set at the low level through the NMOS transistor MN10 at the time of power-up, so that the signal path of the transmission gate TG10 is cut off and the PMOS transistor MP14 is turned-on. This allows the PMOS transistor MP13 to be turned-off. Accordingly, the power voltage is supplied to the local power line PWRL_LOCO connected to the memory cells of the repair unit.

Figure 13:
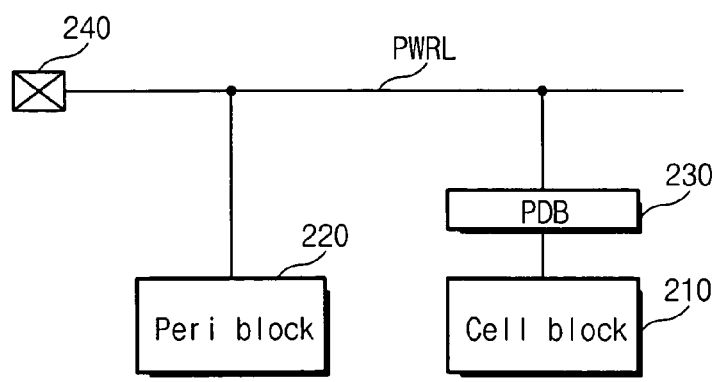
FIG. 13 is a schematic block diagram illustrating a semiconductor memory device in accordance with another embodiment of the present invention.

FIG. 13 is a schematic block diagram illustrating a semiconductor memory device in accordance with another embodiment of the present invention.

Referring to FIG. 13, the semiconductor memory device 200 includes a cell array block 210, a peripheral circuit block 220, and a power distribution block 230 (designated as "PDB" in the drawings). The semiconductor memory device shown in FIG. 13 is different from that of FIG. 1 in that a single power system is provided in the normal operation mode and the test operation mode. That is, in the normal and test operation modes, the peripheral circuit block 220 and the power distribution block 230 receive the power voltage inputted through the pad 240.

As described above, the semiconductor memory device according to various exemplary embodiments of the present invention allows for determination of the row or column in which the memory cell(s) are causing standby current failure. The power voltage supplied to the memory cells of the rows or columns of the repair unit including the defective row or column is cut off.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
a first line for receiving a power voltage;
a plurality of repair units, each of the plurality of repair units comprising an array of memory cells arranged in rows and columns;
a selection circuit for outpitting selection signals for selecting for testing the rows in one of the repair units in response to a row address;
second power lines, each of the second power lines common-connected to the memory cells of a corresponding repair unit; and
a switch circuit for connecting one of the second power lines to the first power line in response to the selection signals, in a test operation mode such that power is turned off from the rows of memory cells not selected for testing and in a normal operation mode, power is restored to the memory cells not selected for testing,
wherein the switch circuit comprises switches, each of the switches connected to a corresponding second power line, wherein each of the switches comprises:
a NOR gate for receiving the control signal and a corresponding selection signal, and
a PMOS transistor for connecting the first power line with a corresponding second power line in response to an output signal of the NOR gate.

2. The semiconductor memory device of claim 1, further comprising first and second pads for respectively receiving the power voltage.

3. The semiconductor memory device of claim 2, wherein the first power line is directly connected to the second pad and is connected to the first pad through a switch transistor.

4. The semiconductor memory device of claim 1, wherein the first power line is connected to a pad for receiving the power voltage.

5. The semiconductor memory device of claim 1, wherein each of the switches further comprises a fuse connected between the PMOS transistor and a corresponding second power line.

6. The semiconductor memory device of claim 5, wherein in the test operation mode, whether the memory cells of the selected rows comprise the memory cell having standby current failure is judged depending on variation of the power voltage.

7. The semiconductor memory device of claim 6, wherein each of the fuses is cut when the memory cells of corresponding rows comprise the memory cell having the standby current failure.

8. The semiconductor memory device of claim 1, further comprising a precharge circuit for precharging the columns.

9. The semiconductor memory device of claim 8, wherein the precharge circuit is inactivated during the test operation mode.

10. A semiconductor memory device comprising;
a first power line for receiving a power voltage;
a plurality of repair units, each of the plurality of repair units comprising an array of memory cells arranged in rows and columns;
a selection circuit for outputting selecting signals for selecting for testing the rows in one of the repair units in response to a row address;
second power lines, each of the second power lines common-connected to the memory cells of a corresponding repair unit; and
a switch circuit for connecting one of the second power lines to the first power line in response to the selection signals, in a test operation mode such that power is turned off from the rows of memory cells not selected for testing and in a normal operation mode, power is restored to the memory cells not selected for testing; and
first and second pads for respectively receiving the power voltage,
wherein the first power line is directly connected to the second pad and is connected to the first pad though a switch transistor, and
wherein the switch transistor is controlled by a control signal that is based on whether the semiconductor memory device is in the test operation mode.

11. A semiconductor memory device comprising:
a first power line for receiving a power voltage;
a plurality of repair units, each of the plurality of repair units comprising an array of memory cells arranged in rows and columns;
a selection-circuit for outputting selection signals for selecting for testing the columns in one of the repair units in response to a column address;
second power lines, each of the second power lines common-connected to the memory cells of a corresponding repair unit; and a switch circuit for connecting one of the second power lines to the first power line in response to the selection signals and disconnecting the remaining second power lines from the first power line, in a test operation mode such that power is turned off from the rows of memory cells not selected for testing and in a normal operation mode, power is restored to the memory cells not selected for testing, wherein the switch circuit comprises switches, each of the switches connected to a corresponding second power line, wherein each of the switches comprises:

a NOR gate for receiving the control signal and a corresponding selection signal, and a PMOS transitor for connecting the first power line with a corresponding second power line in response to an output signal of the NOR gate.

12. The semiconductor memory device of claim 11, further comprising first and second pads for respectively receiving the power voltage.

13. The semiconductor memory device of claim 12, wherein the first power line is directly connected to the second pad and is connected to the first pad through a switch transistor.

14. The semiconductor memory device of claim 11, wherein the first power line is connected to a pad for receiving the power voltage.

15. The semiconductor memory device of claim 11, wherein each of the switches further comprises a fuse connected between the PMOS transistor and a corresponding second power line.

16. The semiconductor memory device of claim 15, wherein in the test operation mode, whether the memory cells of the selected columns comprise the memory cell having standby current failure is judged depending on variation of the power voltage.

17. The semiconductor memory device of claim 16, wherein each of the fuses is cut when the memory cells of corresponding columns comprise the memory cell having the standby current failure.

18. The semiconductor memory device of claim 11, further comprising a precharge circuit for precharging the columns.

19. The semiconductor memory device of claim 18, wherein the precharge circuit inactivated during the test operation mode.

20. A semiconductor memory device comprising:
a first power line for receiving a power voltage;
a plurality of repair units, each of the plurality of repair units comprising an array of memory cells arranged in rows and columns;
a selection-circuit for outputting selection signals for selecting for testing the rows in one of the repair units in response to a row address;
second power lines, each of the second power lines common-connected to the memory cells of a corresponding repair unit; and
a switch circuit for connecting one of the second power lines to the first power line in response to the selection signals, in a test operation mode such that power is turned off from the rows of memory cells not selected for testing and in a normal operation mode, power is restored to the memory cells not selected for testing; and
first and second pads for respectively receiving the power voltage,
wherein the first power line is directly connected to the second pad and is connected to the first pad though a switch transistor, and
wherein the switch transistor is controlled by a control signal that is based on whether the semiconductor memory device is in the test operation mode.

21. A semiconductor memory device comprising:
a first power line for receiving a power voltage;
a plurality of repair units, each of the plurality of repair units comprising an array of memory cells arranged in rows and columns;
second power lines, each of the second power lines common-connected to the memory cells of a corresponding repair unit;
a selection circuit for outputting selection signals for selecting for testing one of the repair units; and
a switch circuit for connecting one of the second power lines to the first power line in response to the selection signals, in a test operation mode such that power is turned off from the repair units of memory cells not selected for testing and in a normal operation mode, power is restored to the memory cells not selected for testing; and
first and second pads for respectively receiving the power voltage,
wherein the first power line is directly connected to the second pad and is connected to the first pad though a switch transistor, and
wherein the switch transitor is controlled by a control signal that is based on whether the semiconductor memory device is in the test operation mode.

22. The semiconductor memory device of claim 21, wherein the switch circuit comprises switches, each of the switches connected to a corresponding second power line, wherein each of the switches comprises:
a NOR gate for receiving the control signal and a corresponding selection signal; and
a PMOS transistor for connecting the first power line with a corresponding second power line in response to an output signal of the NOR gate.

23. The semiconductor memory device of claim 22, wherein each of the switches further comprises a fuse connected between the PMOS transistor and a corresponding second power line.

24. The semiconductor memory device of claim 23, wherein each of the fuses is cut when the memory cells of corresponding columns comprise the memory cell having the standby current failure.

25. The semiconductor memory device of claim 21, wherein in the test operation mode, whether the memory cells of the selected repair unit comprise the memory cell having standby current failure is judged depending on variation of the power voltage.

* * * * *